(12) United States Patent
Zhou (10) Patent No.: US 12,126,102 B2
(45) Date of Patent: Oct. 22, 2024

(54) FLEXIBLE CIRCUIT BOARD, TOUCH DISPLAY MODULE AND TOUCH DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Peng Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 422 days.

(21) Appl. No.: 17/607,009

(22) PCT Filed: Dec. 26, 2020

(86) PCT No.: PCT/CN2020/139722
§ 371 (c)(1),
(2) Date: Oct. 27, 2021

(87) PCT Pub. No.: WO2022/134116
PCT Pub. Date: Jun. 30, 2022

(65) Prior Publication Data
US 2022/0399661 A1    Dec. 15, 2022

(51) Int. Cl.
*H01R 12/61*   (2011.01)
*G06F 3/041*   (2006.01)
(Continued)

(52) U.S. Cl.
CPC .......... *H01R 12/61* (2013.01); *G06F 3/0412* (2013.01); *H10K 59/40* (2023.02); *H10K 77/111* (2023.02); *G06F 3/0446* (2019.05)

(58) Field of Classification Search
CPC ... H01R 12/61; G06F 3/0412; G06F 3/04164; H10K 59/40; H10K 77/111;
(Continued)

(56) References Cited

U.S. PATENT DOCUMENTS

2014/0375907 A1* 12/2014 Wu ..................... G06F 3/04164
349/12
2021/0212207 A1    7/2021 Xiong et al.

FOREIGN PATENT DOCUMENTS

| CN | 110831328 A  | 2/2020 |
| CN | 211090137 U  | 7/2020 |

(Continued)

*Primary Examiner* — Michael C Zarroli
(74) *Attorney, Agent, or Firm* — IP & T GROUP LLP (57) ABSTRACT

A flexible circuit board includes a first substrate, display panel signal traces, a touch chip, at least one second substrate, a touch auxiliary device, first touch signal traces and at least one second touch signal trace. The display panel signal traces, the touch chip and the at least one second substrate are located on the same side of the first substrate; and the touch auxiliary device is located on a second substrate. The first touch signal trace includes a first connection trace and a first transfer trace that are electrically connected to each other. The second touch signal trace includes a second connection trace and a second transfer trace that are electrically connected to each other. The first connection trace and the second connection trace are disposed on the first substrate, and the first transfer trace and the second transfer trace are disposed on the at least one second substrate.

18 Claims, 7 Drawing Sheets

(51) Int. Cl.
*H10K 59/40* (2023.01)
*H10K 77/10* (2023.01)
*G06F 3/044* (2006.01)

(58) Field of Classification Search
CPC ........... H10K 59/131; H05K 2201/041; H05K 1/144; H05K 1/189; H05K 3/361
See application file for complete search history.

(56) References Cited

FOREIGN PATENT DOCUMENTS

| | | |
|---|---|---|
| CN | 111511098 A | 8/2020 |
| CN | 111511100 A | 8/2020 |
| KR | 10-0844764 B1 | 7/2008 |

\* cited by examiner

FIG. 14

FLEXIBLE CIRCUIT BOARD, TOUCH DISPLAY MODULE AND TOUCH DISPLAY APPARATUS

CROSS-REFERENCE TO RELATED APPLICATIONS

This application is a national phase entry under 35 USC 371 of International Patent Application No. PCT/CN2020/139722, filed on Dec. 26, 2020, which is incorporated herein by reference in its entirety.

TECHNICAL FIELD

The present disclosure relates to the field of display technologies, and in particular, to a flexible circuit board, a touch display module and a touch display apparatus.

BACKGROUND

With the rapid development of display technologies, touch display apparatuses have gradually spread in people's lives. A touch display apparatus includes: a display panel, a touch sensor for realizing a touch function, a touch chip and a flexible circuit board. In order to realize lightness and thinness of the touch display apparatus, the touch sensor may be disposed on the display panel. This technology is referred to as on-cell touch technology. In addition, the touch chip may be disposed in the flexible circuit board, transmits signals to the touch sensor through touch signal wires, and obtains sensing signals of the touch sensor.

SUMMARY

In one aspect, a flexible circuit board is provided. The flexible circuit board includes a first substrate, a plurality of display panel signal traces, a touch chip, at least one second substrate, a touch auxiliary device, a plurality of first touch signal traces and at least one second touch signal trace. The plurality of display panel signal traces s and the touch chip are disposed on the first substrate; the at least one second substrate is disposed above a surface of the first substrate provided with the touch chip; and the touch auxiliary device is disposed on one second substrate. The plurality of first touch signal traces are configured to electrically connect a touch structure of a touch display module and the touch chip, and at least one first touch signal trace includes a first connection trace and a first transfer trace that are electrically connected to each other. At least one second touch signal trace is configured to electrically connect the touch auxiliary device and the touch chip, and the second touch signal trace includes a second connection trace and a second transfer trace that are electrically connected to each other. The first connection trace and the second connection trace are both disposed on the first substrate, and the first transfer trace and the second transfer trace are both disposed on the at least one second substrate.

In some embodiments, orthogonal projections of the first transfer trace and the second transfer trace on the first substrate are both at least partially overlapped with an orthogonal projection of at least one display panel signal trace on the first substrate.

In some embodiments, the flexible circuit board further includes a connector and at least one third touch signal trace. The connector is disposed on the first substrate; and the at least one third touch signal trace is configured to electrically connect the touch auxiliary device and the connector. The third touch signal trace includes a third connection trace and a third transfer trace that are electrically connected to each other. The third connection trace is disposed on the first substrate, and the third transfer trace is disposed on a second substrate; and an orthogonal projection of the third transfer trace on the first substrate is at least partially overlapped with an orthogonal projection of at least one display panel signal trace on the first substrate.

In some embodiments, first connection traces of the plurality of first touch signal traces are arranged substantially in parallel. The at least one second touch signal trace includes a plurality of second touch signal traces, and second connection traces of the plurality of second touch signal traces are arranged substantially in parallel. The at least one third touch signal trace includes a plurality of third touch signal traces, and third connection traces of the plurality of third touch signal traces are arranged substantially in parallel.

In some embodiments, the first transfer trace, the second transfer trace, the third transfer trace and the touch auxiliary device are disposed on at least one surface of the at least one second substrate away from the first substrate.

In some embodiments, a plurality of via holes are provided in the at least one second substrate, and each via hole extends through a corresponding second substrate in a thickness direction of the second substrate. The flexible circuit board further includes a plurality of transfer electrodes disposed between the at least one second substrate and the first substrate. The first transfer trace of each first touch signal trace passes through a via hole and is electrically connected to the first connection trace of the first touch signal trace through a transfer electrode; the second transfer trace of each second touch signal trace passes through another via hole and is electrically connected to the second connection trace of the second touch signal trace through another transfer electrode; and the third transfer trace of each third touch signal trace passes through yet another via hole and is electrically connected to the third connection trace of the third touch signal trace through yet another transfer electrode.

In some embodiments, the first transfer trace, the second transfer trace, the third transfer trace and the touch auxiliary device are disposed on a same second substrate.

In some embodiments, the first transfer trace, the second transfer trace and the third transfer trace are arranged substantially in parallel.

In some embodiments, the second substrate includes a wiring region, a first bonding region and a second bonding region. The first transfer trace, the second transfer trace and the third transfer trace are arranged on the wiring region. The first bonding region and the second bonding region are disposed at opposite ends of the wiring region in an extension direction of the first transfer trace. Two ends of the first transfer trace extend to the first bonding region and the second bonding region, and are electrically connected to the first connection trace; one end of the second transfer trace extends to one of the first bonding region and the second bonding region, and is electrically connected to the second connection trace; and one end of the third transfer trace extends to another one of the first bonding region and the second bonding region, and is electrically connected to the third connection trace.

In some embodiments, the flexible circuit board further includes a plurality of transfer electrodes. The plurality of transfer electrodes are configured to connect the first transfer trace to the first connection trace, connect the second transfer trace to the second connection trace, and connect the third transfer trace to the third connection trace; a part of transfer electrodes in the plurality of transfer electrodes are disposed on the first bonding region, and another part of transfer electrodes in the plurality of transfer electrodes are disposed on the second bonding region.

In some embodiments, transfer electrodes disposed on the first bonding region and/or the second bonding region are arranged in a plurality of rows, and each row includes transfer electrodes arranged in a first direction; and the first direction is substantially parallel to the extension direction of the first transfer trace; and in a second direction, transfer electrodes in two adjacent rows are staggered to each other; and the second direction is substantially perpendicular to the extension direction of the first transfer trace.

In some embodiments, the second substrate further includes an auxiliary device region disposed on one of two sides of the wiring region in a direction perpendicular to the extension direction of the first transfer trace; and the touch auxiliary device is disposed on the auxiliary device region.

In some embodiments, the first connection trace includes a first segment and a second segment. One end of the first segment is electrically connected to the touch structure, and another end of the first segment is electrically connected to the first transfer trace. The second segment is disposed separately from the first segment. One end of the second segment is electrically connected to the first transfer trace, and another end of the second segment is electrically connected to the touch chip.

In some embodiments, the first segment and the second segment are located at two ends of the first transfer trace.

In some embodiments, a number of second substrates is at least two, and the second transfer trace and the touch auxiliary device are disposed on a second substrate different from a second substrate on which the first transfer trace is disposed.

In another aspect, a touch display module is provided. The touch display module includes a display panel, a touch structure and the flexible circuit board as described in any of the above embodiments. The touch structure is disposed on a display side of the display panel. The plurality of display panel signal traces of the flexible circuit board are electrically connected to the display panel, and the plurality of first touch signal traces of the flexible circuit board are electrically connected to the touch structure.

In some embodiments, the touch display module further includes a main board, and the flexible circuit board further includes a connector electrically connected to the main board.

In yet another aspect, a touch display apparatus is provided, including the touch display module as described in the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "connected" and "electrically connected" and their derivatives may be used. For example, the term "connected" may be used in the description of some embodiments to indicate that two or more components are in direct physical contact or electrical contact with each other. For another example, the term "electrically connected" may be used in the description of some embodiments to indicate that two or more components are in direct electrical contact. However, the term "electrically connected" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" means an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, the term such as "about", "substantially" or "approximately" includes a stated value and an average value that is within an acceptable deviation range of a specific value. The acceptable deviation range is determined by a person of ordinary skill in the art in view of measurement in question and errors associated with a particular amount of measurement (i.e., limitations of a measurement system).

Figure 1:
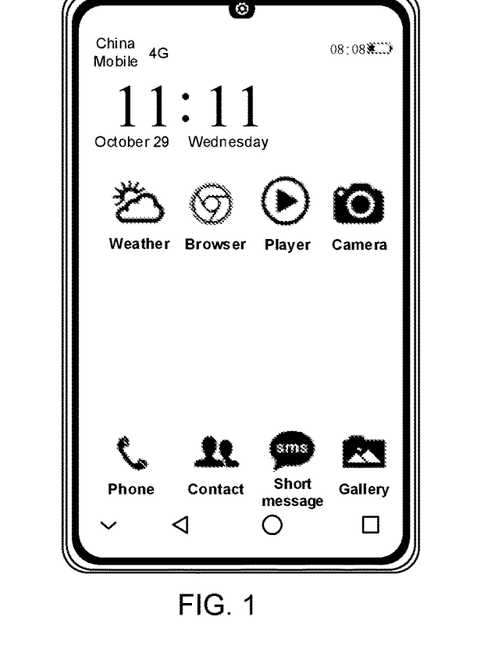
FIG. 1 is a schematic diagram of a touch display apparatus, in accordance with some embodiments.

A display apparatus is an apparatus or device for visually displaying electronic information. Referring to FIG. 1, a touch display apparatus 100 is a display apparatus that may be operated and controlled by clicking a screen with a finger (or a touch pen or other tools), which includes at least a touch display panel 1 (also referred to as a touch display screen, a touch panel, a touch screen, etc.). For example, the touch display apparatus 100 may be any product or component with a display function, such as a smart phone, a tablet computer, a television, a display, a notebook computer, and other wearable electronic devices (e.g., a watch).

The touch display apparatus 100 may be a liquid crystal display (LCD) apparatus; the touch display apparatus 100 may also be an electroluminescence display apparatus or a photoluminescence display apparatus. In a case where the touch display apparatus 100 is an electroluminescent display apparatus, the electroluminescent display apparatus may be an organic light-emitting diode (OLED) display apparatus or a quantum dot light-emitting diode (QLED) display apparatus. In a case where the touch display apparatus 100 is a photoluminescence display apparatus, the photoluminescence display apparatus may be a quantum dot photoluminescence display apparatus.

Figure 2:
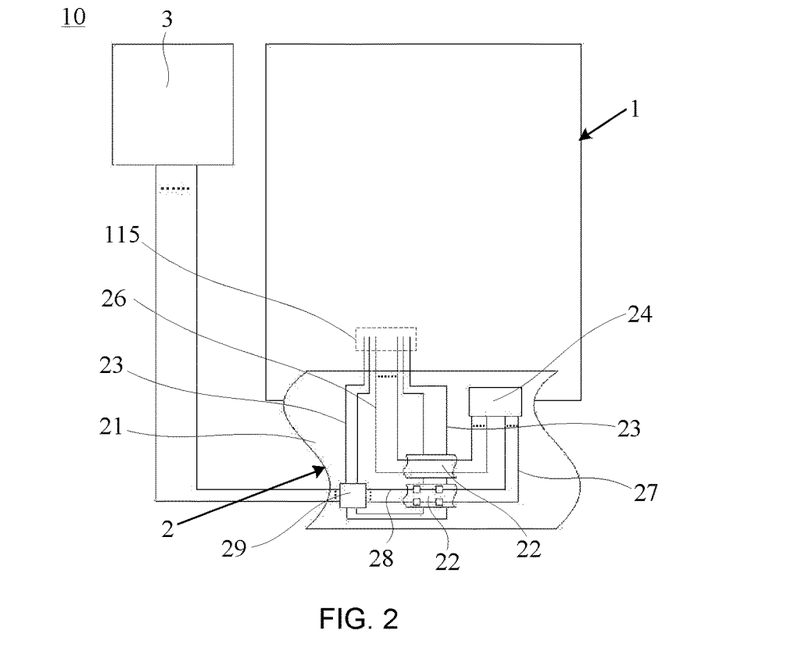
FIG. 2 is a structural diagram of a touch display module, in accordance with some embodiments.
Figure 3:
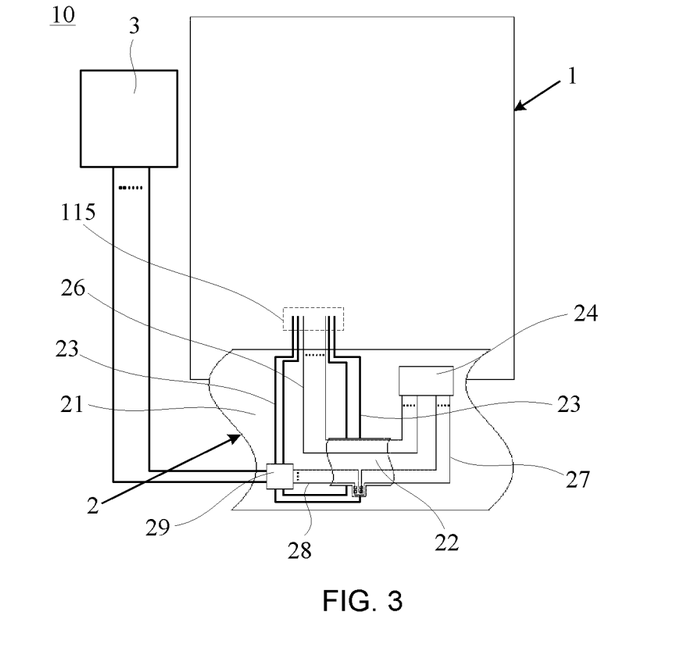
FIG. 3 is a structural diagram of another touch display module, in accordance with some embodiments.

FIG. 2 is a structural diagram of a touch display module 10, in accordance with some embodiments; and FIG. 3 is a structural diagram of another touch display module 10, in accordance with some embodiments. The touch display apparatus 100 includes a touch display module 10. As shown in FIG. 2 or FIG. 3, the touch display module 10 includes the touch display panel 1 and a flexible circuit board 2, and the touch display panel 1 and the flexible circuit board 2 are bonded.

Figure 4:
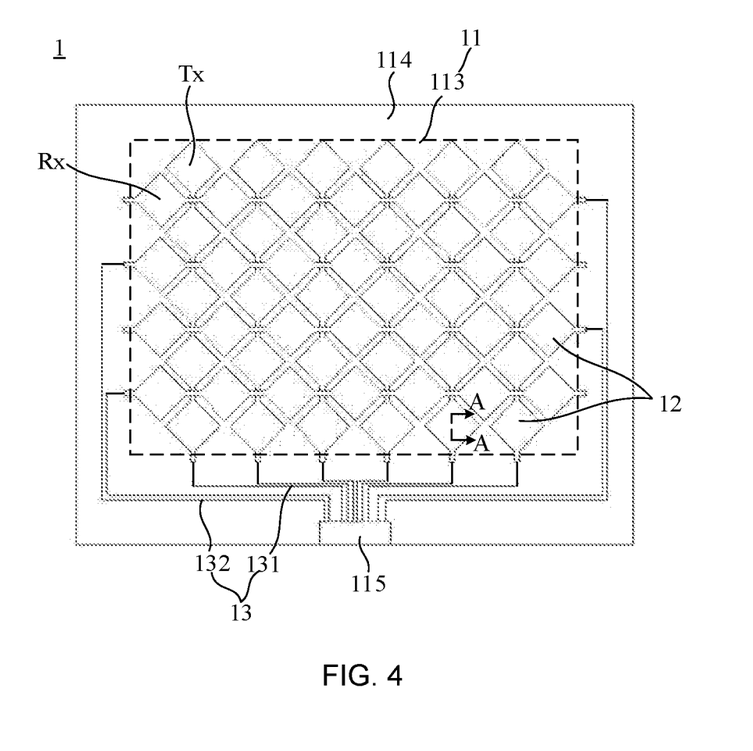
FIG. 4 is a structural diagram of a touch display panel, in accordance with some embodiments.
Figure 5:
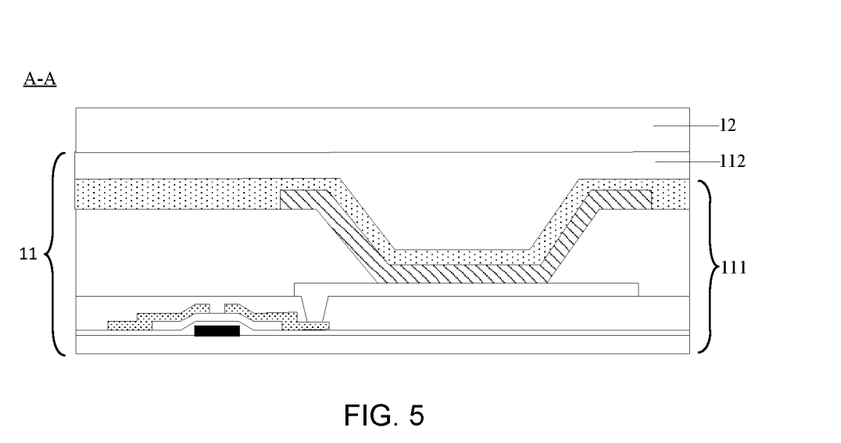
FIG. 5 is a partial sectional view of the touch display panel in FIG. 4 taken along the A-A line.

FIG. 4 is a structural diagram of a touch display panel 1, in accordance with some embodiments; and FIG. 5 is a partial sectional view of the touch display panel in FIG. 4 taken along the A-A line. As shown in FIG. 4, the touch display panel 1 includes a display panel 11 and a touch structure 12 that are superimposed.

In some embodiments, the display panel 11 may be an electroluminescence display panel or a photoluminescence display panel. In this case, as shown in FIG. 5, the display panel 11 includes a display substrate 111 and an encapsulation layer 112 for encapsulating the display substrate 111. Here, the encapsulation layer 112 may be an encapsulation film or an encapsulation substrate. Referring to FIG. 5, the touch structure 12 is directly disposed on the encapsulation layer 112. That is, no other film layer is provided between the touch structure 12 and the encapsulation layer 112. In this case, a thickness of the touch display apparatus 100 is small, which is beneficial to achieving lightness and thinness.

In some embodiments, as shown in FIG. 4, the display panel 11 has a display region 113, a peripheral region 114 and a bonding region 115. An orthogonal projection of the display region 113 on a plane perpendicular to a thickness direction of the display panel 11 is within an orthogonal projection of a touch region where the touch structure 12 is located on the plane, the peripheral region 114 is provided with touch wires 13, and the bonding region 115 is provided with a plurality of bonding electrodes. The touch wires 13 are configured to electrically connect the touch structure 12 and bonding electrodes in the bonding region 115.

In some embodiments, as shown in FIG. 4, the touch structure 12 includes a plurality of touch driving electrodes Tx and a plurality of touch detecting electrodes Rx that cross each other and are insulated from each other. The touch wires 13 include first touch wires 131 and second touch wires 132 that are spaced apart. One end of a first touch wire 131 is electrically connected to a touch driving electrode Tx, and the other end of the first touch wire 131 is electrically connected to a bonding electrode in the bonding region 115. One end of a second touch wire 132 is electrically connected to a touch detecting electrode Rx, and the other end of the second touch wire 132 is electrically connected to another bonding electrode in the bonding region 115.

In this case, the touch driving electrode Tx and the touch detecting electrode Rx may form a capacitive node. A pulse voltage or an alternating voltage applied to the touch driving electrode Tx by a touch chip 24 (referring to FIG. 3) may induce charge on the touch detecting electrode Rx, and an amount of charge induced may be easily affected (e.g., by touch or proximity of a finger). When a finger touches or approaches the capacitive node, a capacitance change may occur at the capacitive node, and the touch chip 24 may measure the capacitance change through the touch detecting electrode Rx. By measuring the capacitance changes of the touch structure 12, the touch chip 24 may determine a position of the touch or proximity in the touch region of the touch structure 12.

Referring to FIG. 2 or 3, the bonding of the touch display panel 1 and the flexible circuit board 2 means that the flexible circuit board 2 includes display panel signal traces 23 and touch signal traces (including first touch signal traces 26 and second touch signal trace(s) 27), which are electrically connected to bonding electrodes in the bonding region 115 of the display panel 11 of the touch display panel 1. The display panel signal traces 23 are electrically connected to the display panel 11 through bonding electrodes, and are configured to transmit display driving signals to the display panel 11 (as shown in FIG. 4). The first touch signal traces 26 are electrically connected to the touch structure 12 of the touch display panel 1 through bonding electrodes.

In order to avoid overlapping between the display panel signal traces 23 and the touch signal traces included in the flexible circuit board 2 and reduce signal interference between the touch signal traces and the display panel signal traces 23, in some related arts, the touch signal traces are separated from the display panel signal traces 23 by providing an insulating layer, and the flexible circuit board 2 is manufactured by using a circuit board with at least four layers. One layer of the at least four layers is a substrate, two layers are conductive layers that are used for arranging the touch signal traces and the display panel signal traces 23, and the remaining layer is an insulating layer provided between the two conductive layers. It will be understood that as the number of layers of the circuit board increases, a manufacturing cost and a product defect rate of the circuit board both increase exponentially. Therefore, a manufacturing cost and a product defect rate of the flexible circuit board 2 are relatively high.

Figure 6:
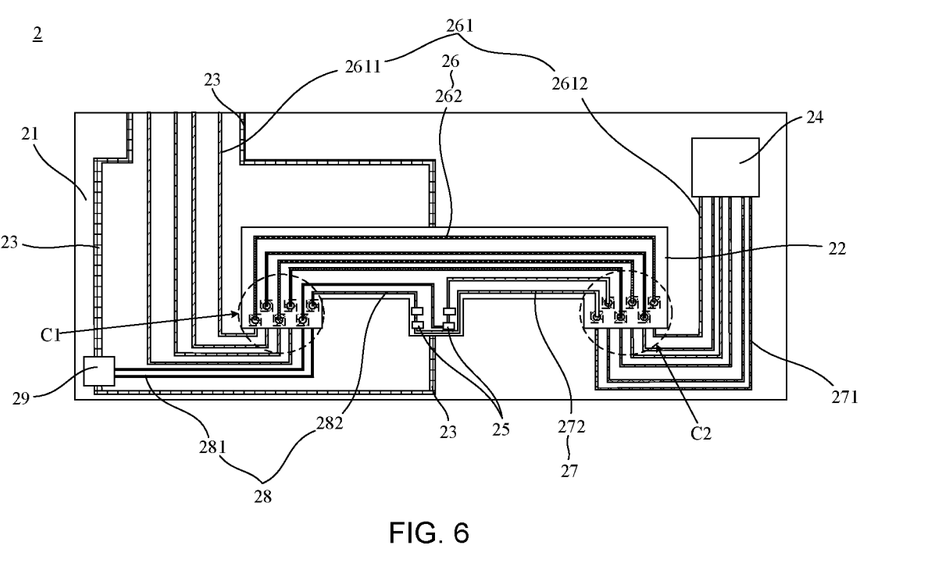
FIG. 6 is a top view of a flexible circuit board, in accordance with some embodiments.
Figure 7:
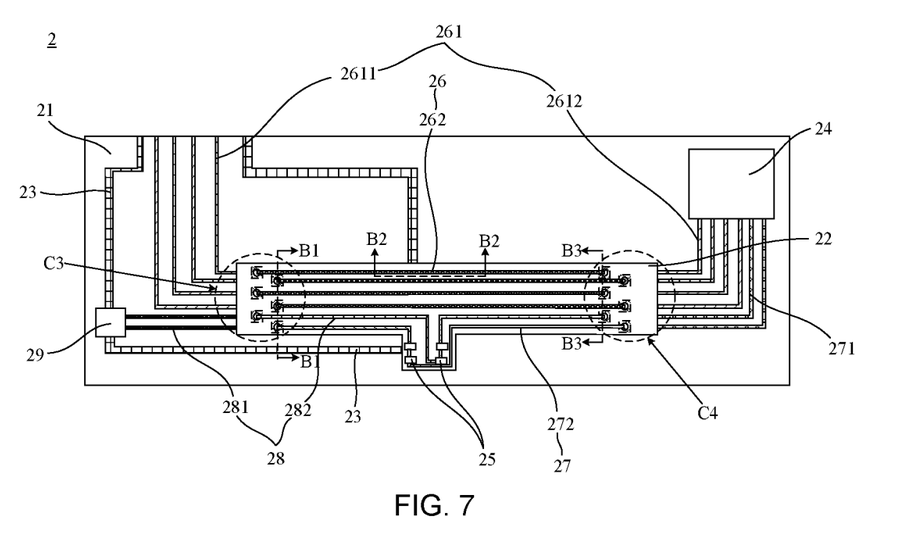
FIG. 7 is a top view of another flexible circuit board, in accordance with some embodiments.
Figure 8:
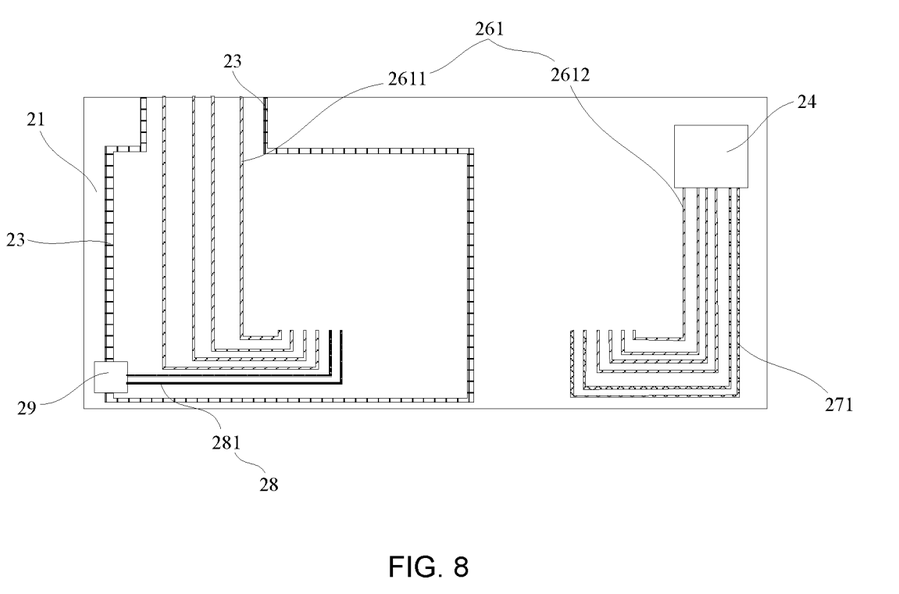
FIG. 8 is a top view of a first substrate and structures disposed thereon, in accordance with some embodiments.
Figure 10:
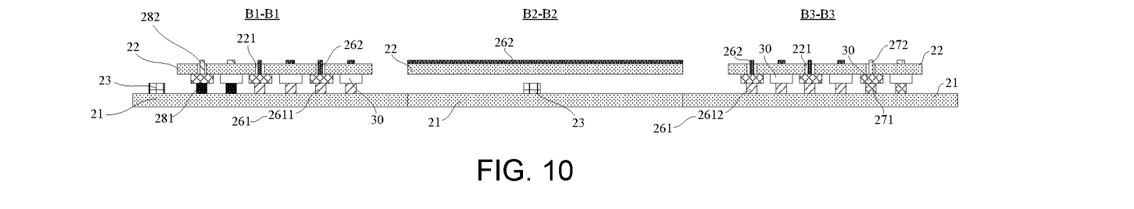
FIG. 10 is a partial sectional view of the flexible circuit board in FIG. 7 taken along the B1-B1 line, the B2-B2 line and the B3-B3 line.

FIG. 6 is a top view of a flexible circuit board 2, in accordance with some embodiments; FIG. 7 is a top view of another flexible circuit board 2, in accordance with some embodiments; FIG. 8 is a top view of a first substrate 21 and structures disposed thereon, in accordance with some embodiments; and FIG. 10 is a partial sectional view of the flexible circuit board in FIG. 7 taken along the B1-B1, the B2-B2 line and the B3-B3 line. Referring to FIG. 6 or 7, the flexible circuit board 2 includes the first substrate 21 and at least one second substrate 22 disposed on the first substrate 21. FIGS. 3, 6 and 7 illustrate a flexible circuit board 2 including one second substrate 22, and FIG. 2 illustrates a flexible circuit board 2 including two second substrates 22.

Referring to FIG. 6 or 7, some embodiments of the present disclosure provide a flexible circuit board 2. The flexible circuit board 2 includes the first substrate 21, the at least one second substrate 22, the plurality of display panel signal traces 23, the touch chip 24, touch auxiliary device(s) 25, the first touch signal traces 26 and the second touch signal trace(s) 27.

The first substrate 21 is a flexible substrate. The flexible substrate may be made of one or more of polyethylene terephthalate, ethylene terephthalate, polyether ether ketone, polystyrene, polycarbonate, polyarylate, polyarylester, polyimide, polyvinyl chloride, polyethylene and a textile fiber, and embodiments of the present disclosure are not limited thereto.

Referring to FIG. 8, the plurality of display panel signal traces 23 are disposed on the first substrate 21. Referring to FIG. 2 or 3, the plurality of display panel signal traces 23 are configured to supply display driving signals to the display panel 11 (as shown in FIG. 4) in the touch display panel 1.

With continued reference to FIG. 8, the touch chip 24 is disposed on a surface of the first substrate 21 provided with the plurality of display panel signal traces 23. Referring to FIG. 3, the touch chip 24 is configured to supply touch driving signals to the touch structure 12 (as shown in FIG. 4) in the touch display panel 1.

Referring to FIG. 6 or 7, the at least one second substrate 22 is disposed above a surface of the first substrate 21 provided with the touch chip 24. The second substrate 22 is a flexible substrate. The flexible substrate may be made of one or more of polyethylene terephthalate, ethylene terephthalate, polyether ether ketone, polystyrene, polycarbonate, polyarylate, polyarylester, polyimide, polyvinyl chloride, polyethylene and a textile fiber, and the embodiments of the present disclosure are not limited thereto.

Figure 9:
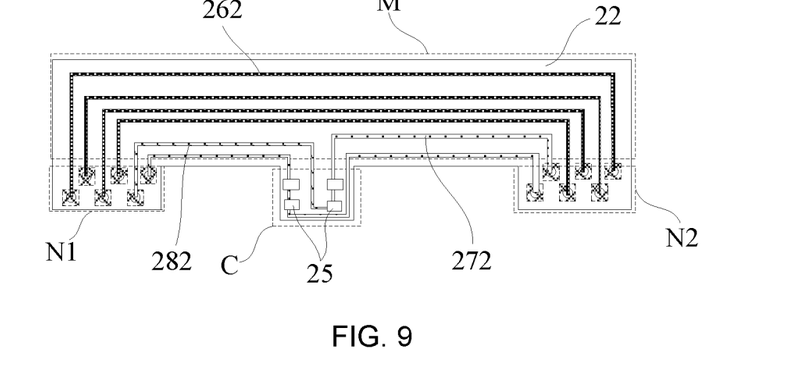
FIG. 9 is a top view of a second substrate and structures disposed thereon, in accordance with some embodiments.

Referring to FIG. 9, the touch auxiliary device 25 is disposed on one second substrate 22. The touch auxiliary device 25 refers to a device used to assist in analysis of the touch chip, in calculation of a position of a contact point, or in signal conversion. In some embodiments, the touch auxiliary device 25 includes at least one of a touch power chip, a filter device, a boost/buck capacitor, and the embodiment of the present disclosure is not limited thereto.

Referring to FIGS. 3 and 6 or FIGS. 3 and 7, the plurality of first touch signal traces 26 are configured to electrically connect the touch structure 12 and the touch chip 24 of the touch display module 10. Referring to FIGS. 7 and 10, at least one of the plurality of first touch signal traces 26 includes a first connection trace 261 and a first transfer trace 262 that are electrically connected to each other. The first connection trace 261 is disposed on the first substrate 21, and the first transfer trace 262 is disposed on one second substrate 22.

Referring to FIG. 6 or 7, the at least one second touch signal trace 27 is configured to electrically connect the touch auxiliary device 25 and the touch chip 24. Referring to FIGS. 7 and 10, the second touch signal trace 27 includes a second connection trace 271 and a second transfer trace 272 that are electrically connected to each other. The second connection trace 271 is disposed on the first substrate 21, and the second transfer trace 272 is disposed on one second substrate 22.

In some embodiments, the first substrate 21 and a first conductive layer thereon form a circuit board with two layers. The first conductive layer includes first connection traces 261 in the first touch signal traces 26 that are insulated from each other on the first substrate 21, second connection traces 271 in second touch signal traces 27 that are insulated from each other on the first substrate, and the display panel signal traces 23 that are insulated from each other. The first connection traces 261, the second connection traces 271, and the display panel signal trace 23 are insulated from each other.

The second substrate 22 and a second conductive layer thereon form a circuit board with two layers, and the second conductive layer includes first transfer traces 262 and second transfer traces 272 that are insulated from each other.

It can be seen from the above that the flexible circuit board 2 may be manufactured by two or more circuit boards, and each circuit board has two layers. It will be understood that, since the manufacturing cost and the product defect rate of the circuit board both increase exponentially as the number of layers of the circuit board increases, the flexible circuit board 2 is manufactured by two or more circuit boards, and each circuit board has two layers, which avoids using a circuit board structure with at least four layers in the related art, reduces the manufacturing cost of the flexible circuit board 2, and improves a product yield of the flexible circuit board 2.

In addition, the touch auxiliary device 25 is disposed on the second substrate 22, and the second substrate 22 is disposed a surface of the first substrate 21 provided with the touch chip 24. Based on this, there is no need to provide a mounting and fixing region for the touch auxiliary device 25 on the first substrate 21, and an occupied area of the first substrate 21 may be reduced. In this way, when the flexible circuit board 2 is folded to a back side of the touch display panel 1, it occupies a smaller back region of the touch display panel 1, and an occupied area of other devices on the back side of the touch display panel 1 may be designed to be larger, which is beneficial to performance improvement. For example, an area occupied by a battery on the back side of the touch display panel 1 may be designed to be larger, so that a larger battery capacity may be obtained.

In some embodiments, as shown in FIG. 6 or 7, an orthogonal projection of the first transfer trace 262 on the first substrate 21 is at least partially overlapped with an orthogonal projection of at least one display panel signal trace 23 on the first substrate 21. An orthogonal projection of the second transfer trace 272 on the first substrate 21 is at least partially overlapped with an orthogonal projection of at least one display panel signal trace 23 on the first substrate 21. In this case, since the first transfer trace 262 and the second transfer trace 272 are disposed on the second substrate(s) 22, and the display panel signal trace 23 is disposed on the first substrate 21, signal interference generated between the first transfer trace 262 and the display panel signal trace 23 and between the second transfer trace 272 and the display panel signal trace 23 is relatively small.

Orthogonal projections of the first transfer trace 262 and the second transfer trace 272 on the first substrate 21 are at least partially overlapped with the orthogonal projection of at least one display panel signal trace 23 on the first substrate 21, which may make a wiring arrangement in the flexible circuit board 2 more compact and reduce the occupied area of the first substrate 21. In this way, when the flexible circuit board 2 is folded to the back side of the touch display panel 1, it occupies a smaller back region of the touch display panel 1, and an occupied area of other devices on the back side of the touch display panel 1 may be designed to be larger, which is beneficial to performance improvement. For example, an area occupied by a battery on the back side of the touch display panel 1 may be designed to be larger, so that a larger battery capacity may be obtained.

In some embodiments, referring to FIG. 3, the above flexible circuit board 2 further includes a connector 29 and at least one third touch signal trace 28, and the third touch signal trace 28 is configured to electrically connect the touch auxiliary device 25 and the connector 29. Referring to FIG. 6 or 7, the third touch signal trace 28 includes a third connection trace 281 and a third transfer trace 282 that are electrically connected to each other. The third connection trace 281 is disposed on the first substrate 21, and the third transfer trace 282 is disposed on one second substrate 22; and an orthogonal projection of the third transfer trace 282 on the first substrate 21 is at least partially overlapped with an orthogonal projection of at least one display panel signal trace on the first substrate 21. The connector 29 is disposed on the first substrate 21 and is configured to be electrically connected to a main board 3 (as shown in FIG. 3). The connector 29 is a connecting device for electrically connecting the main board 3 and circuit structures included in the flexible circuit board 2.

For example, as shown in FIG. 3, the main board 3 may be electrically connected to the touch auxiliary device 25 (referring to FIG. 6) and the touch chip 24 of the flexible circuit board 2 through the connector 29, so that the main board 3 provides the touch auxiliary device 25 and the touch chip 24 with control signals for controlling the touch auxiliary device 25 and the touch chip 24.

For example, as shown in FIG. 3, the main board 3 may also be electrically connected to the display panel signal trace 23 of the flexible circuit board 2 through the connector 29, and the display panel signal trace 23 is electrically connected to the display panel 11, so that the main board 3 provides the display panel 11 with a control signal for controlling the display panel 11.

The plurality of first touch signal traces 26 are configured to electrically connect the touch structure 12 and the touch chip 24. Referring to FIGS. 7 and 10, in some embodiments, at least part of the plurality of first touch signal traces 26 include the first connection trace 261 and the first transfer trace 262 that are electrically connected to each other. The first connection trace 261 includes a first segment 2611 and a second segment 2612 separated from the first segment 2611; and the first segment 2611 and the second segment 2612 are located at opposite ends of the first transfer trace 262.

For example, referring to FIG. 6 or 7, one end of the first segment 2611 is electrically connected to a bonding electrode in the bonding region 115 (as shown in FIG. 4), and the other end thereof is electrically connected to the first transfer trace 262; and one end of the second segment 2612 is electrically connected to the first transfer trace 262, and the other end thereof is electrically connected to the touch chip 24. One end of each of remaining first touch signal trace(s) 26 in the plurality of first touch signal traces 26 is electrically connected to a bonding electrode in the bonding region 115 (as shown in FIG. 4), and the other end thereof is electrically connected to the touch chip 24. Bonding electrodes are electrically connected to the touch structure 12 through the touch wires 13, so that the touch chip 24 supplies the touch driving signal to the touch structure 12 disposed on the display panel 11.

With this wiring manner, a wiring design of the flexible circuit board 2 is facilitated, and the second substrate(s) 22 may be provided only in a region where the first touch signal traces 26 cross the display panel signal traces, which is beneficial to reduce an area occupied by the second substrate 22 and reduce the manufacturing cost.

The second touch signal trace 27 is configured to electrically connect the touch auxiliary device 25 and the touch chip 24. In some embodiments, referring to FIGS. 6 and 10 or FIGS. 7 and 10, one end of the second transfer trace 272 is electrically connected to the touch auxiliary device 25 on the second substrate 22, and the other end thereof is electrically connected to the second connection trace 271; and one end of the second connection trace 271 is electrically connected to the second transfer trace 272, and the other end thereof is electrically connected to the touch chip 24, so that the touch auxiliary device 25 and the touch chip 24 are electrically connected to each other.

The third touch signal trace 28 is configured to electrically connect the touch auxiliary device 25 and the connector 29. In some embodiments, referring to FIGS. 6 and 10 or FIGS. 7 and 10, one end of the third connection trace 281 is electrically connected to the connector 29 on the first substrate 21, and the other end thereof is electrically connected to the third transfer trace 282; and one end of the third transfer trace 282 is electrically connected to the third connection trace 281, and the other end thereof is electrically connected to the touch auxiliary device 25. As shown in FIG. 3, the connector 29 is electrically connected to the main board 3, so that the main board 3 provides the touch auxiliary device 25 and the touch chip 24 with control signals for controlling the touch auxiliary device 25 and the touch chip 24.

It will be noted that the first conductive layer on the first substrate 21 includes the first connection trace 261, the second connection trace 271, the third connection trace 281 and the display panel signal trace, and the second conductive layer on the second substrate(s) 22 includes the first transfer trace 262, the second transfer trace 272 and the third transfer trace 282. The first conductive layer and the second conductive layer may both be made of metal.

In some embodiments, referring to FIG. 6 or 7, the first connection traces 261 of the first touch signal traces 26 are arranged substantially in parallel. In some embodiments, the flexible circuit board 2 includes a plurality of second touch signal traces 27, and the second connection traces 271 of the plurality of second touch signal traces 27 are arranged substantially in parallel. In some other embodiments, the flexible circuit board 2 includes a plurality of third touch signal traces 28, and the third connection traces 281 of the plurality of third touch signal traces 28 are arranged substantially in parallel. With this arrangement manner, the wiring design of the flexible circuit board 2 is facilitated, which is beneficial to reduce an area occupied by the first substrate 21, and may reduce the manufacturing cost; and signal interference generated between the touch signal traces on the first substrate 21 may be reduced, and a touch accuracy of the touch display panel 1 may be improved.

In some embodiments, as shown in FIGS. 6 and 10 or FIGS. 7 and 10, the first transfer trace 262, the second transfer trace 272, the third transfer trace 282 and the touch auxiliary device 25 are all disposed on surface(s) of the second substrate(s) 22 away from the first substrate 21. In this case, the first transfer trace 262, the second transfer trace 272, the third transfer trace 282 and the touch auxiliary device 25 are located on a side of the second substrate(s) 22 away from the first substrate 21. In this way, an influence of other signals on touch driving signals provided by the first transfer trace 262, the second transfer trace 272, and the third transfer trace 282 may be reduced, and the touch accuracy of the touch display panel 1 is further improved.

For example, referring to FIG. 10, a plurality of via holes 221 (referring to FIG. 11) are provided in the second substrate(s) 22, and each via hole 221 extends through a corresponding second substrate 22 in a thickness direction of the second substrate 22. The flexible circuit board 2 further includes a plurality of transfer electrodes 30, and the plurality of transfer electrodes 30 are disposed between the second substrate(s) 22 and the first substrate 21; the first transfer trace 262 of each first touch signal trace 26 passes through a via hole 221 and is electrically connected to the first connection trace 261 of the first touch signal trace 26 through a transfer electrode 30; the second transfer trace 271 of each second touch signal trace 27 passes through another via hole 221 and is electrically connected to the second connection trace 272 of the second touch signal trace 27 through another transfer electrode 30; and the third transfer trace 282 of each third touch signal trace 28 passes through yet another via hole 221 and is electrically connected to the third connection trace 282 of the third touch signal trace 28 through yet another transfer electrode 30.

This arrangement is beneficial for electrical connection of the first transfer trace 262, the second transfer trace 272 and the third transfer trace 282 to the first connection trace 261, the second connection trace 271 and the third connection trace 281 on the first substrate 21, respectively. In addition, the first transfer trace 262, the second transfer trace 272 and the third transfer trace 282 may be connected to corresponding transfer electrodes 30 by crimping, and a risk of uneven crimping is low.

It will be noted that the transfer electrode 30 may be made of solder paste, and the transfer electrode 30 may be electrically connected to the corresponding first connection trace 261, second connection trace 271 or third connection trace 281 by soldering, so that the second substrate 22 is fixed on the first substrate 21.

In some embodiments, the transfer electrode 30 includes a connecting portion at least partially covering the via hole 221 and a bonding pad around the via hole 221. The connecting portion is electrically connected to the corresponding first transfer trace 262, second transfer trace 272 or third transfer trace 282, and the bonding pad is connected to the corresponding first connection trace 261, second connection trace 271 or third connection trace 281. An area of an orthogonal projection of the transfer electrode 30 on the first substrate 21 may be larger than an area of an orthogonal projection of the via hole 221 on the first substrate 21, and the transfer electrode 30 completely covers the via hole 221.

In an actual production process, the transfer electrode 30 may be set in any shape. For example, a shape of the transfer electrode 30 is a circle, an ellipse, a rectangle, a polygon, etc., and the embodiments of the present disclosure are not limited thereto. In the figures, the transfer electrode 30 is illustrated by taking an example in which the shape of the transfer electrode 30 is a rectangle, the area of the orthogonal projection of the transfer electrode 30 on the first substrate 21 is larger than the area of the orthogonal projection of the via hole 221 on the first substrate 21, and the transfer electrode 30 completely covers the via hole 221.

Similarly, in the actual production process, the via hole 221 may be set to be an opening in any shape. For example, the opening shape of the via hole 221 is a circle, an ellipse, a rectangle, a polygon, etc., and the embodiments of the present disclosure is not limited thereto. In the figures, the opening shape of the via hole 221 is illustrated as a circle. In a case where the opening shape of the via hole 221 is a circle, a diameter of the via hole 221 is in a range from 0.30 mm to 0.40 mm. For example, the diameter of the via hole 221 is any one of 0.30 mm, 0.35 mm and 0.40 mm. Of course, in the actual production process, a size of the via hole 221 may be adjusted according to a space size of the flexible circuit board 2 and a size of the transfer electrode 30. For example, in a case where the size of the flexible circuit board 2 is large and the size of the transfer electrode 30 is relatively large, the size of the via hole 221 may be increased.

In some embodiments, as shown in FIG. 2, the number of second substrates 22 is at least two, and the second transfer trace 272 and the touch auxiliary device 25 are disposed on a second substrate 22 different from a second substrate 22 on which the first transfer trace 262 is disposed. FIG. 2 shows a case where the number of second substrates 22 is two. In this case, the second transfer trace 272 and the touch auxiliary device 25 are disposed on one of the two second substrates 22, and the first transfer trace 262 is disposed on the other second substrate 22.

In some other embodiments, as shown in FIG. 3, the first transfer trace 262, the second transfer trace 272 and the touch auxiliary device 25 are all disposed on the same second substrate 22.

Optionally, the first transfer trace 262, the second transfer trace 272 and the third transfer trace 282 are arranged substantially in parallel. In this way, the wiring design on the second substrate(s) 22 is facilitated, which is beneficial to reduce the area occupied by the second substrate 22, and may reduce the manufacturing cost; and signal interference generated between the first transfer trace 262, the second transfer trace 272 and the third transfer trace 282 may be reduced, and the touch accuracy of the touch display panel 1 may be improved.

Referring to FIG. 9, the second substrate 22 includes a wiring region M, a first bonding region N1 and a second bonding region N2. The first transfer trace 262, the second transfer trace 272 and the third transfer trace 282 are disposed on the wiring region M, and the first bonding region N1 and the second bonding region N2 are disposed at opposite ends of the wiring region M in an extending direction of the first transfer trace 262. Two ends of the first transfer trace 262 extend to the first bonding region N1 and the second bonding region N2, and are electrically connected to the first connection trace 261; one end of the second transfer trace 272 extends to one of the first bonding region N1 and the second bonding region N2, and is electrically connected to the second connection trace 271; and one end of the third transfer trace 282 extends to the other of the first bonding region N1 and the second bonding region N2, and is electrically connected to the third connection trace 281.

Figure 11:
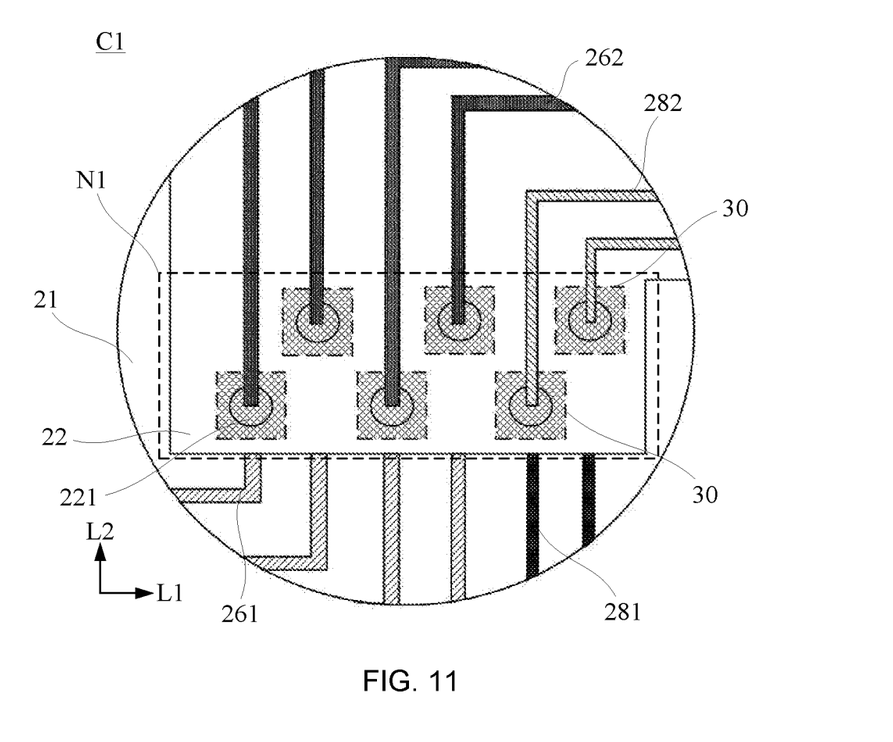
FIG. 11 is an enlarged view of region C1 in FIG. 6.
Figure 12:
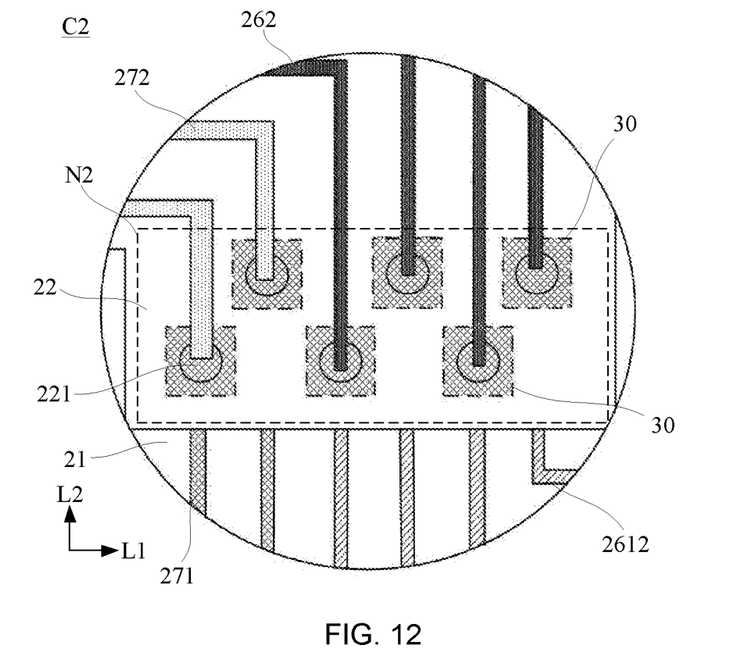
FIG. 12 is an enlarged view of region C2 in FIG. 6.

In some embodiments, referring to FIGS. 9, 11 and 12, the flexible circuit board 2 further includes a plurality of transfer electrodes 30. A part of transfer electrodes 30 of the plurality of transfer electrodes 30 are disposed on the first bonding region N1, and another part of transfer electrodes 30 are disposed on the second bonding region N2.

For example, referring to FIGS. 11 and 12, transfer electrodes 30 disposed on the first bonding region N1 and/or the second bonding region N2 are arranged in a plurality of rows, and each row includes transfer electrodes 30 arranged in a first direction L1. The first direction L1 is substantially parallel to the extending direction of the first transfer trace 262. In a second direction L2, transfer electrodes 30 in two adjacent rows are staggered to each other; and the second direction L2 is substantially perpendicular to the extending direction of the first transfer trace 262. FIGS. 11 and 12 show a situation in which transfer electrodes 30 on the first bonding region N1 and transfer electrodes 30 on the second bonding region N2 are arranged in two rows.

Figure 13:
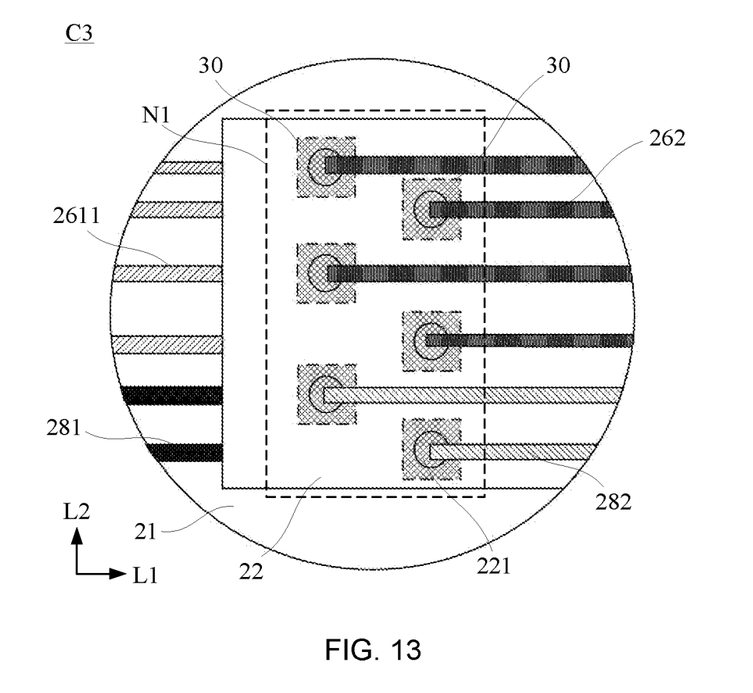
FIG. 13 is an enlarged view of region C3 in FIG. 7.
Figure 14:
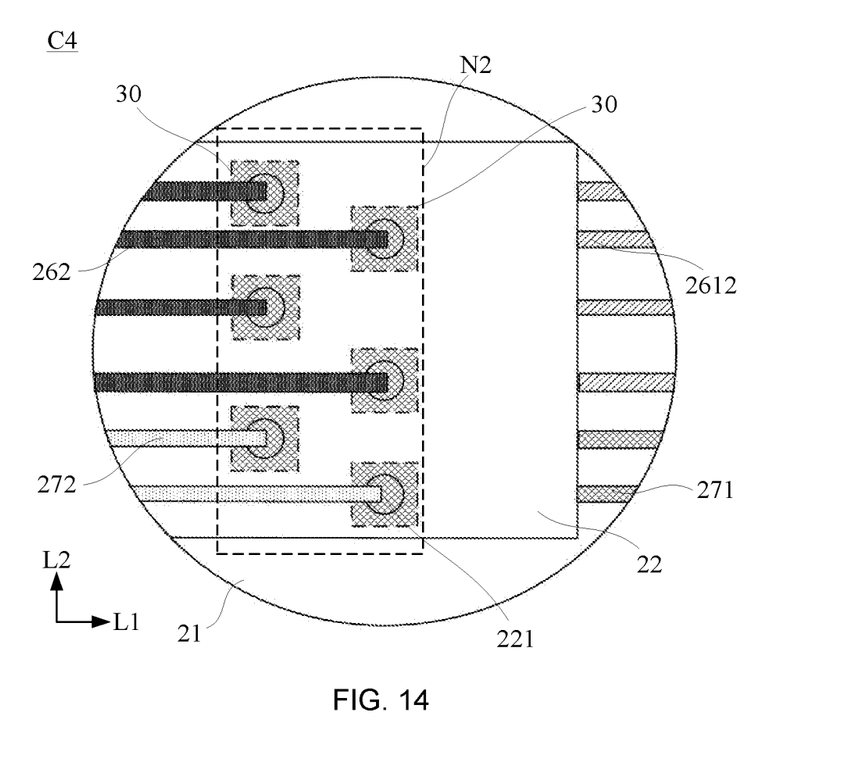
FIG. 14 is an enlarged view of region C4 in FIG. 7.

For example, referring to FIGS. 13 and 14, transfer electrodes 30 disposed on the first bonding region N1 and/or the second bonding region N2 are arranged in a plurality of rows, and each row includes transfer electrodes 30 arranged in the first direction L1. The first direction L1 is substantially parallel to the extending direction of the first transfer trace 262. In the second direction L2, transfer electrodes 30 in two adjacent rows are staggered to each other; and the second direction L2 is substantially perpendicular to the extending direction of the first transfer trace 262. FIGS. 13 and 14 show a situation in which the transfer electrodes 30 on the first bonding region N1 and the transfer electrodes 30 on the second bonding region N2 are arranged in two rows.

In some embodiments, a minimum separation distance between two adjacent transfer electrodes 30 in the same row is approximately equal.

For example, the minimum separation distance between two adjacent transfer electrodes 30 in each row is in a range from 0.20 mm to 0.30 mm. For example, the minimum separation distance between two adjacent transfer electrodes 30 is any one of 0.20 mm, 0.25 mm or 0.30 mm.

In some embodiments, referring to FIGS. 3 and 9, the second substrate 22 further includes an auxiliary device region C, the auxiliary device region C is disposed on one of two sides of the wiring region M in a direction perpendicular to the extending direction of the first transfer trace 262 (as shown in FIG. 7), and the touch auxiliary device 25 is disposed on the auxiliary device region 24. In this way, the first transfer trace 262 may be disposed on a side of the second transfer trace 272 and the third transfer trace 282 away from the auxiliary device region 24, so as to prevent the first transfer trace 262 from intersecting with the second transfer trace 262 or the third transfer trace 282, thereby facilitating a wiring design on the second substrate 22.

Some embodiments of the present disclosure also provide a touch display module 10. As shown in FIGS. 2 and 4 or as shown in FIGS. 3 and 4, the touch display module 10 includes a display panel 11, a touch structure 12 and the flexible circuit board 2. The touch structure 12 is disposed on a display side of the display panel 11, and the flexible circuit board 2 is electrically connected to the display panel 11 and the touch structure 12.

It will be noted that the touch display module 10 further includes a display driver chip. The display driver chip may be disposed outside the display panel 11, and is electrically connected to the display panel 11 through the flexible circuit board 2; or the display driver chip may also be disposed inside the display panel 11, e.g., in the peripheral region, and in this case, the display driver chip may be, for example, a display driver integrated circuit (DDIC).

In some embodiments, as shown in FIG. 2 or 3, the touch display module further includes a main board 3, and the flexible circuit board 2 further includes a connector 29. The connector 29 is electrically connected to the main board 3, so that the touch auxiliary device 25 and the touch chip 24 are electrically connected to the main board 3.

Here, the main board 3 is a control center of the touch display module 10, connects various parts of the entire touch display module 10 by utilizing various interfaces and lines, and executes various functions and processes data by running or executing software programs, thereby performing overall control on the touch display module 10.

For example, referring to FIG. 2 or 3, the main board 3 may provide the touch auxiliary device 25 and the touch chip 24 with control signals for controlling the touch auxiliary device 25 and the touch chip 24.

For example, referring to FIG. 2 or 3, the main board 3 may also provide the display panel 11 with a control signal for controlling the display panel 11.

As shown in FIG. 1, some embodiments of the present disclosure also provide a touch display apparatus 100 for displaying images (i.e., pictures), which may be a product including the touch display module 10. For example, the touch display apparatus 100 may be a flat panel display (FPD), a micro display or other displays. If divided according to whether a user may see a scene on a back of the display, the display may be a transparent display or an opaque display. If divided according to whether the display may be bent or rolled, the display may be a flexible display or a conventional display (which may be referred to as a rigid display). The touch display apparatus 100 may also be a product including a display, such as a computer display, a television, a billboard, a laser printer with display capability, a telephone, a mobile phone, a personal digital assistant (PDA), a laptop computer, a digital camera, a camcorder, a viewfinder, a vehicle, a large-area wall, a theater screen or a stadium sign, etc.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A touch display module, comprising:
   a display panel;

a touch structure disposed on a display side of the display panel; and
a flexible circuit board, wherein the flexible circuit board comprises:
a first substrate;
a plurality of display panel signal traces and a touch chip that are disposed on the first substrate;
at least one second substrate disposed above a surface of the first substrate provided with the touch chip;
a touch auxiliary device disposed on the at least one second substrate;
a plurality of first touch signal traces configured to electrically connect the touch structure of the touch display module and the touch chip, at least one first touch signal trace including a first connection trace and a first transfer trace, the first connection trace and the first transfer trace being electrically connected to each other; and
at least one second touch signal trace configured to electrically connect the touch auxiliary device and the touch chip, the second touch signal trace including a second connection trace and a second transfer trace, the second connection trace and the second transfer trace being electrically connected to each other, wherein
the first connection trace and the second connection trace are both disposed on the first substrate, and the first transfer trace and the second transfer trace are both disposed on the at least one second substrate; and
orthogonal projections of the first transfer trace and the second transfer trace on the first substrate are both at least partially overlapped with an orthogonal projection of at least one display panel signal trace on the first substrate;
wherein the plurality of display panel signal traces of the flexible circuit board are electrically connected to the display panel, and the plurality of first touch signal traces of the flexible circuit board are electrically connected to the touch structure.

2. The touch display module according to claim 1, further comprising:
a connector disposed on the first substrate; and
at least one third touch signal trace configured to electrically connect the touch auxiliary device and the connector, the third touch signal trace including a third connection trace and a third transfer trace, the third connection trace and the third transfer trace being electrically connected to each other, wherein
the third connection trace is disposed on the first substrate, and the third transfer trace is disposed on the at least one second substrate; and an orthogonal projection of the third transfer trace on the first substrate is at least partially overlapped with an orthogonal projection of at least one display panel signal trace on the first substrate.

3. The touch display module according to claim 1, wherein the first connection trace includes:
a first segment, wherein one end of the first segment is electrically connected to the touch structure, and another end of the first segment is electrically connected to the first transfer trace; and
a second segment disposed separately from the first segment, wherein one end of the second segment is electrically connected to the first transfer trace, and another end of the second segment is electrically connected to the touch chip.

4. The touch display module according to claim 1, wherein a number of second substrates is at least two, and the second transfer trace and the touch auxiliary device are disposed on a second substrate different from a second substrate on which the first transfer trace is disposed.

5. The touch display module according to claim 1, further comprising a main board; and
the flexible circuit board further including a connector electrically connected to the main board.

6. A touch display apparatus, comprising the touch display module according to claim 1.

7. A touch display module, comprising:
a display panel;
a touch structure disposed on a display side of the display panel; and
a flexible circuit board, wherein the flexible circuit board comprises:
a first substrate;
a plurality of display panel signal traces and a touch chip that are disposed on the first substrate;
at least one second substrate disposed above a surface of the first substrate provided with the touch chip;
a touch auxiliary device disposed on the at least one second substrate;
a plurality of first touch signal traces configured to electrically connect the touch structure of the touch display module and the touch chip, at least one first touch signal trace including a first connection trace and a first transfer trace, the first connection trace and the first transfer trace being electrically connected to each other;
at least one second touch signal trace configured to electrically connect the touch auxiliary device and the touch chip, the second touch signal trace including a second connection trace and a second transfer trace, the second connection trace and the second transfer trace being electrically connected to each other;
a connector disposed on the first substrate; and
at least one third touch signal trace configured to electrically connect the touch auxiliary device and the connector, the third touch signal trace including a third connection trace and a third transfer trace, the third connection trace and the third transfer trace being that are electrically connected to each other, wherein
the first connection trace and the second connection trace are both disposed on the first substrate, and the first transfer trace and the second transfer trace are both disposed on the at least one second substrate; and
the third connection trace is disposed on the first substrate, and the third transfer trace is disposed on the at least one second substrate; and an orthogonal projection of the third transfer trace on the first substrate is at least partially overlapped with an orthogonal projection of at least one display panel signal trace on the first substrate;
wherein the plurality of display panel signal traces of the flexible circuit board are electrically connected to the display panel, and the plurality of first touch signal traces of the flexible circuit board are electrically connected to the touch structure.

8. The touch display module according to claim 7, wherein first connection traces of the plurality of first touch signal traces are arranged substantially in parallel;

the at least one second touch signal trace includes a plurality of second touch signal traces, and second connection traces of the plurality of second touch signal traces are arranged substantially in parallel; and the at least one third touch signal trace includes a plurality of third touch signal traces, and third connection traces of the plurality of third touch signal traces are arranged substantially in parallel.

9. The touch display module according to claim 7, wherein the first transfer trace, the second transfer trace, the third transfer trace and the touch auxiliary device are disposed on at least one surface of the at least one second substrate away from the first substrate.

10. The touch display module according to claim 9, wherein a plurality of via holes are provided in the at least one second substrate, and each via hole extends through a corresponding second substrate in a thickness direction of the corresponding second substrate; and the flexible circuit board further comprises: a plurality of transfer electrodes disposed between the at least one second substrate and the first substrate, wherein the first transfer trace of each first touch signal trace passes through a via hole and is electrically connected to the first connection trace of the first touch signal trace through a transfer electrode; the second transfer trace of each second touch signal trace passes through another via hole and is electrically connected to the second connection trace of the second touch signal trace through another transfer electrode; and the third transfer trace of each third touch signal trace passes through yet another via hole and is electrically connected to the third connection trace of the third touch signal trace through yet another transfer electrode.

11. The touch display module according to claim 7, wherein the first transfer trace, the second transfer trace, the third transfer trace and the touch auxiliary device are disposed on a same second substrate.

12. The touch display module according to claim 11, wherein the first transfer trace, the second transfer trace and the third transfer trace are arranged substantially in parallel.

13. The touch display module according to claim 11, wherein the same second substrate includes a wiring region, a first bonding region, and a second bonding region;

the first transfer trace, the second transfer trace and the third transfer trace are arranged on the wiring region;

the first bonding region and the second bonding region are disposed at opposite ends of the wiring region in an extension direction of the first transfer trace;

two ends of the first transfer trace extend to the first bonding region and the second bonding region, and are electrically connected to the first connection trace; and one end of the second transfer trace extends to one of the first bonding region and the second bonding region, and is electrically connected to the second connection trace; and one end of the third transfer trace extends to another one of the first bonding region and the second bonding region, and is electrically connected to the third connection trace.

14. The touch display module according to claim 9, wherein the flexible circuit board further comprises a plurality of transfer electrodes; the plurality of transfer electrodes are configured to connect the first transfer trace to the first connection trace, connect the second transfer trace to the second connection trace, and connect the third transfer trace to the third connection trace; a part of transfer electrodes in the plurality of transfer electrodes are disposed on the first bonding region, and another part of transfer electrodes in the plurality of transfer electrodes are disposed on the second bonding region.

15. The touch display module according to claim 14, wherein transfer electrodes disposed on the first bonding region and/or the second bonding region are arranged in a plurality of rows, and each row includes transfer electrodes arranged in a first direction; and the first direction is substantially parallel to the extension direction of the first transfer trace; and in a second direction, transfer electrodes in two adjacent rows are staggered to each other; and the second direction is substantially perpendicular to the extension direction of the first transfer trace.

16. The touch display module according to claim 13, wherein the same second substrate further includes an auxiliary device region disposed on one of two sides of the wiring region in a direction perpendicular to the extension direction of the first transfer trace; and the touch auxiliary device is disposed on the auxiliary device region.

17. A touch display module, comprising:
a display panel;
a touch structure disposed on a display side of the display panel; and
a flexible circuit board, wherein the flexible circuit board comprises:
a first substrate;
a plurality of display panel signal traces and a touch chip that are disposed on the first substrate;
at least one second substrate disposed above a surface of the first substrate provided with the touch chip;
a touch auxiliary device disposed on the at least one second substrate;
a plurality of first touch signal traces configured to electrically connect the touch structure of the touch display module and the touch chip, at least one first touch signal trace including a first connection trace and a first transfer trace, the first connection trace and the first transfer trace being electrically connected to each other; and
at least one second touch signal trace configured to electrically connect the touch auxiliary device and the touch chip, the second touch signal trace including a second connection trace and a second transfer trace, the second connection trace and the second transfer trace being electrically connected to each other, wherein
the first connection trace and the second connection trace are both disposed on the first substrate, and the first transfer trace and the second transfer trace are both disposed on the at least one second substrate;
the first connection trace includes a first segment, wherein
one end of the first segment is electrically connected to the touch structure, and another end of the first segment is electrically connected to the first transfer trace; and
a second segment disposed separately from the first segment, wherein one end of the second segment is electrically connected to the first transfer trace, and another end of the second segment is electrically connected to the touch chip;
wherein the plurality of display panel signal traces of the flexible circuit board are electrically connected to the display panel, and the plurality of first touch signal traces of the flexible circuit board are electrically connected to the touch structure.

18. The touch display module according to claim 17, wherein the first segment and the second segment are located at two ends of the first transfer trace.

\* \* \* \* \*

UNITED STATES PATENT AND TRADEMARK OFFICE
CERTIFICATE OF CORRECTION

PATENT NO. : 12,126,102 B2
APPLICATION NO. : 17/607009
DATED : October 22, 2024
INVENTOR(S) : Peng Zhou Page 1 of 1

It is certified that error appears in the above-identified patent and that said Letters Patent is hereby corrected as shown below:

In the Claims

In Column 17, Line 60, Claim 14 please change "14. The touch display module according to claim 9" should be --14. The touch display module according to claim 13--

Signed and Sealed this
Eleventh Day of February, 2025

Coke Morgan Stewart
*Acting Director of the United States Patent and Trademark Office*